(12) United States Patent
Doan

(10) Patent No.: US 7,169,691 B2
(45) Date of Patent: Jan. 30, 2007

(54) METHOD OF FABRICATING WAFER-LEVEL PACKAGING WITH SIDEWALL PASSIVATION AND RELATED APPARATUS

(75) Inventor: Trung T. Doan, Vallejo, CA (US)

(73) Assignee: Micron Technology, Inc., Boise, ID (US)

( * ) Notice: Subject to any disclaimer, the term of this patent is extended or adjusted under 35 U.S.C. 154(b) by 202 days.

(21) Appl. No.: 10/767,952

(22) Filed: Jan. 29, 2004

(65) Prior Publication Data

US 2005/0167799 A1 Aug. 4, 2005

(51) Int. Cl.
*H01L 21/00* (2006.01)
*H01L 21/44* (2006.01)
*H01L 21/46* (2006.01)
*H01L 23/495* (2006.01)

(52) U.S. Cl. ............... 438/598; 438/51; 438/55; 438/64; 438/106; 438/112; 438/124; 438/126; 438/127; 438/460; 257/668

(58) Field of Classification Search ............... None
See application file for complete search history.

(56) References Cited

U.S. PATENT DOCUMENTS

| | | | |
|---|---|---|---|
| 3,924,323 A * | 12/1975 | Trevail et al. | ............... 438/17 |
| 5,136,364 A | 8/1992 | Byrne | |
| 5,389,182 A | 2/1995 | Mignardi | |
| 5,451,550 A | 9/1995 | Wills et al. | |
| 5,682,065 A | 10/1997 | Farnworth et al. | |
| 5,742,094 A | 4/1998 | Ting | |
| 5,851,911 A | 12/1998 | Farnworth | |
| 5,933,713 A | 8/1999 | Farnworth | |
| 5,956,605 A | 9/1999 | Akram et al. | |
| 6,008,070 A | 12/1999 | Farnworth | |
| 6,063,646 A * | 5/2000 | Okuno et al. | ............... 438/107 |
| 6,074,896 A * | 6/2000 | Dando | ............... 438/114 |
| 6,251,703 B1 | 6/2001 | Van Campenhout et al. | |
| 6,303,977 B1 | 10/2001 | Schroen et al. | |
| 6,387,185 B2 | 5/2002 | Doering et al. | |
| 6,399,464 B1 * | 6/2002 | Muntifering et al. | ........ 438/465 |
| 6,656,820 B2 * | 12/2003 | Liu | ............... 438/460 |
| 6,909,784 B1 * | 6/2005 | Sugahara | ............... 380/201 |
| 6,964,915 B2 * | 11/2005 | Farnworth et al. | ............ 438/460 |
| 2001/0018229 A1 * | 8/2001 | Kato et al. | ............... 438/106 |
| 2002/0192927 A1 * | 12/2002 | Yamada | ............... 438/460 |
| 2003/0071354 A1 * | 4/2003 | Tsai et al. | ............... 257/738 |
| 2004/0023438 A1 * | 2/2004 | Egawa et al. | ............... 438/113 |

(Continued)

*Primary Examiner*—Carl Whitehead, Jr.
*Assistant Examiner*—James M. Mitchell
(74) *Attorney, Agent, or Firm*—TraskBritt

(57) ABSTRACT

A method of fabricating a chip-scale or wafer-level package having passivation layers on substantially all surfaces thereof to form a hermetically sealed package. The package may be formed by disposing a first passivation layer on the passive or backside surface of a semiconductor wafer. The semiconductor wafer may be attached to a flexible membrane and diced, such as by a wafer saw, to separate the semiconductor devices. Once diced, the flexible membrane may be stretched so as to laterally displace the individual semiconductor devices away from one another and substantially expose the side edges thereof. Once the side edges of the semiconductor devices are exposed, a passivation layer may be formed on the side edges and active surfaces of the devices. A portion of the passivation layer over the active surface of each semiconductor device may be removed so as to expose conductive elements formed therebeneath.

43 Claims, 7 Drawing Sheets

U.S. PATENT DOCUMENTS

2004/0121514 A1* 6/2004 Yoo et al. .................. 438/106
2005/0073058 A1* 4/2005 Kuo et al. ................. 257/786
2005/0085008 A1* 4/2005 Derderian et al. .......... 438/106
2005/0104221 A1* 5/2005 Memis ....................... 257/778
2006/0005911 A1* 1/2006 Kubo et al. .................. 156/84

* cited by examiner

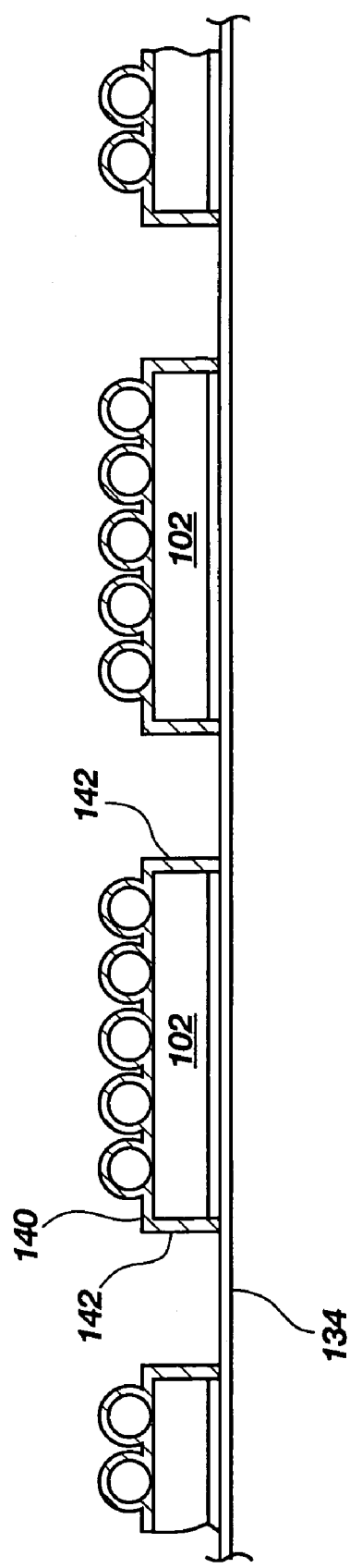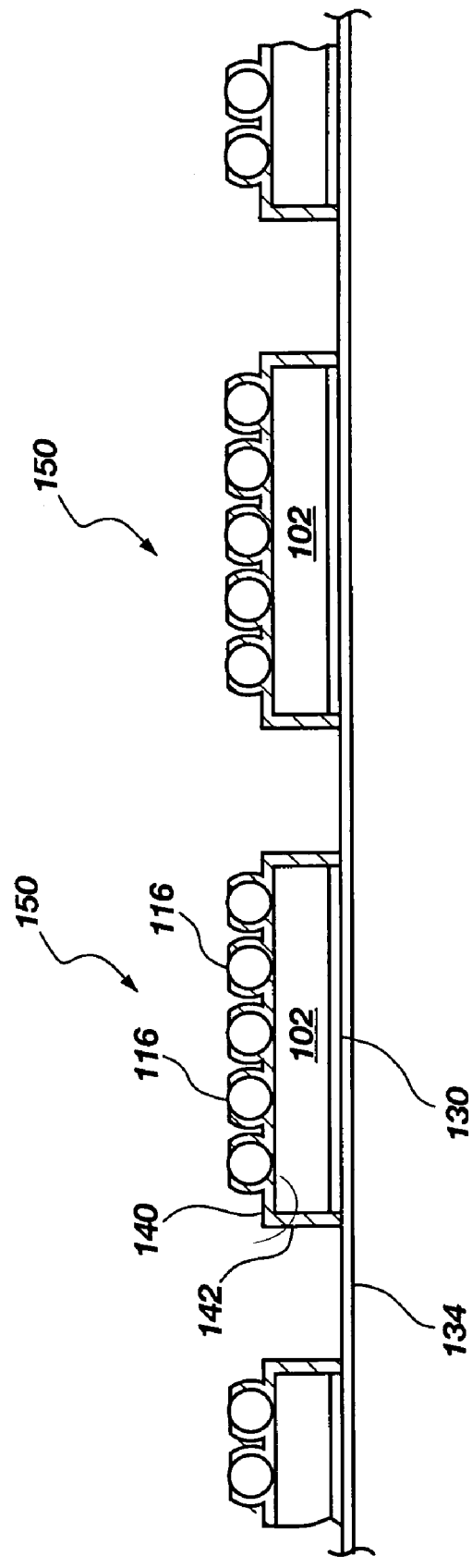

METHOD OF FABRICATING WAFER-LEVEL PACKAGING WITH SIDEWALL PASSIVATION AND RELATED APPARATUS

BACKGROUND OF THE INVENTION

1. Field of the Invention

The present invention relates to wafer-level packaging for a semiconductor die. More particularly, the present invention relates to a semiconductor die having all of its sides sealed by a passivation layer and an improved method for forming the passivation layers on the semiconductor die.

2. State of the Art

A solid-state electronic device in the form of a semiconductor die or chip is conventionally manufactured of materials such as silicon, germanium, or gallium arsenide. Circuitry is formed on an active surface of the semiconductor die and may include further levels of circuitry within the die itself. Bond pads are conventionally formed on the active surface to provide electrical contacts for the semiconductor die circuitry. Due to the materials used and the intricate nature of construction, semiconductor dice are highly susceptible to physical damage or contamination from environmental conditions including, for example, moisture.

Conventionally, attempts to protect a semiconductor die from environmental conditions have included mounting the die within a plastic, metal or ceramic package that provides hermetic sealing and prevents environmental elements from physically contacting the die. Such a package also conventionally includes conductive leads or similar conductive elements for attaching the die bond pads to external electrical connections. Such a packaging approach, while providing some protection for the semiconductor die from external conditions, increases the cost of production by requiring additional materials and manufacturing steps. Additionally, such a packaging approach results in a relatively large device size which may unnecessarily consume valuable real estate when mounted to a carrier substrate. Moreover, the conductive lead structures used in such packaging approaches may negatively influence processing speed and, further, may present opportunities for moisture incursion at interfaces between the conductive leads and other packaging materials.

There have been some efforts to reduce the size and cost of these electronic devices which have resulted in, more or less, doing away with the above-described packaging materials. Such efforts include, for example, fabrication processes commonly referred to as wafer-level packaging (WLP) or chip-scale packaging (CSP). Such packaging methods include disposing a relatively thin protective coating or passivation layer on one or more surfaces of the semiconductor die during fabrication. Connecting elements, such as conductive bumps, are formed over the die bond pads using a variety of known techniques such as screen printing or ball bumping. A redistribution layer may also be formed on the active surface of the semiconductor die to allow the formation of conductive bumps at locations other than directly above the bond pads. The conductive bumps may then be electrically connected to circuitry on a carrier substrate or other device through a process such as tape automated bonding (TAB), or by direct attachment including mounting the semiconductor die in a flip-chip fashion on the carrier substrate.

Formation of the passivation layer on the surfaces of the semiconductor die may include sealing exposed die surfaces with a coating of, for example, silicon nitride (SiN), silicon dioxide ($SiO_2$), or other materials such as an epoxy or a polymer. In prior art processes, such coatings might be deposited on the active and passive surfaces of a wafer, which contains an array of solid-state electronic devices, with the wafer being subsequently singulated to provide individual semiconductor dice. The semiconductor dice which result from this fabrication process suffer from the fact that their side edges are left exposed after singulation of the dice from the wafer. The possibility remains, therefore, that moisture may enter the side edges of an individual die and damage nearby circuitry.

It is further noted that, when processes such as wafer-level packaging and chip-scale packaging are utilized, difficulties may arise in the dicing of the wafer to effect singulation of the semiconductor dice therefrom. Such dicing is conventionally accomplished by cutting the wafer along street lines between the individual semiconductor dice with a wafer saw. However, when a passivation layer or coating on the wafer is formed of a polymer or similar material, the wafer saw tends to gum-up during singulation, thereby reducing cutting efficiency and requiring down time for cleaning and maintenance of the saw.

In order to rectify some of these shortcomings, various attempts have been made to provide additional passivation layers on the side edges of a semiconductor die. For example, U.S. Pat. No. 5,451,550 to Wills et al., U.S. Pat. No. 5,742,094 to Ting and U.S. Pat. No. 5,933,713 to Farnworth teach methods of providing side edge passivation layers to semiconductor dice. While the methods disclosed by these patents provide such side edge passivation layers, they may require further processing of the semiconductor dice on an individual basis, which becomes time consuming, introduces additional expense, and may introduce additional complexities into the fabrication process.

Other attempts to improve WLP and CSP processes include, for instance, U.S. Pat. No. 5,956,605 to Akram et al. and U.S. Pat. No. 6,303,977 to Schroen et al., which generally contemplate forming side edge passivation layers after wafer singulation. However, such methods may still result in die surfaces which are not completely coated and may require additional coating steps subsequent to attachment of the semiconductor die to a carrier substrate or other device.

In view of the shortcomings in the art, it would be advantageous to provide an improved wafer-level packaging method for sealing the surfaces of a semiconductor die.

BRIEF SUMMARY OF THE INVENTION

In accordance with one aspect of the present invention, a method of fabricating semiconductor packages is provided. The method includes providing a semiconductor wafer having a plurality of semiconductor devices formed thereon. The semiconductor wafer is adhered to a flexible membrane and diced to separate the plurality of semiconductor devices and define a plurality of side edges on each semiconductor device of the plurality of semiconductor devices. The flexible membrane is stretched to laterally displace the plurality of semiconductor devices relative to one another, thereby exposing the side edges of each semiconductor device. A passivation layer is then formed on the plurality of side edges of at least one of the plurality of semiconductor devices.

In accordance with another aspect of the present invention, an apparatus is provided for use in fabricating semiconductor devices. The apparatus includes a frame and a membrane coupled to the frame. The membrane is configured to adhere to a surface of a semiconductor wafer. The frame is configured to stretch the membrane in at least one lateral direction while a semiconductor wafer is adhered thereto. The frame may include a plurality of frame members wherein at least two of the plurality of frame members are configured to be displaced laterally away from each other to stretch the membrane in the at least one lateral direction. The membrane may comprise an elastic film and may be formed of a material comprising polyethylene. In another embodiment, the membrane may comprise a flexible resin material.

In accordance with yet another aspect of the present invention, a method of forming a memory device is provided. The method includes providing a semiconductor wafer having a plurality of semiconductor devices formed thereon. The semiconductor wafer is adhered to a flexible membrane and diced to separate the plurality of semiconductor devices and define a plurality of side edges on each semiconductor device of the plurality of semiconductor devices. The flexible membrane is stretched to laterally displace the plurality of semiconductor devices relative to one another, thereby exposing the side edges of each semiconductor device. A passivation layer is then formed on the plurality of side edges of at least one of the plurality of semiconductor devices. With the passivation layers formed on the active surface and side edges of the at least one semiconductor device, the at least one semiconductor device is electrically coupled to a carrier substrate.

In accordance with a further aspect of the present invention, another method of fabricating a semiconductor device is provided. The method includes providing a semiconductor wafer having an active surface and an opposing passive surface and disposing a layer of polymer material on the passive surface. A plurality of cut lines is sawed substantially through the semiconductor wafer to define a plurality of semiconductor devices. Each cut line of the plurality exhibits a depth which does not substantially extend into the layer of polymer. A force is then applied to the semiconductor wafer to fracture the polymer layer along a plurality of lines which substantially corresponds with the plurality of cut lines.

BRIEF DESCRIPTION OF THE SEVERAL VIEWS OF THE DRAWINGS

The foregoing and other advantages of the invention will become apparent upon reading the following detailed description and upon reference to the drawings in which:

FIG. 9 is a partial sectional view of a diced wafer including active surface and side edge passivation layers formed on the individual devices thereof;

FIG. 10 is a partial sectional view showing the semiconductor dice after removing a portion of the active surface passivation layer to expose the conductive bumps.

DETAILED DESCRIPTION OF THE INVENTION

Figure 1:
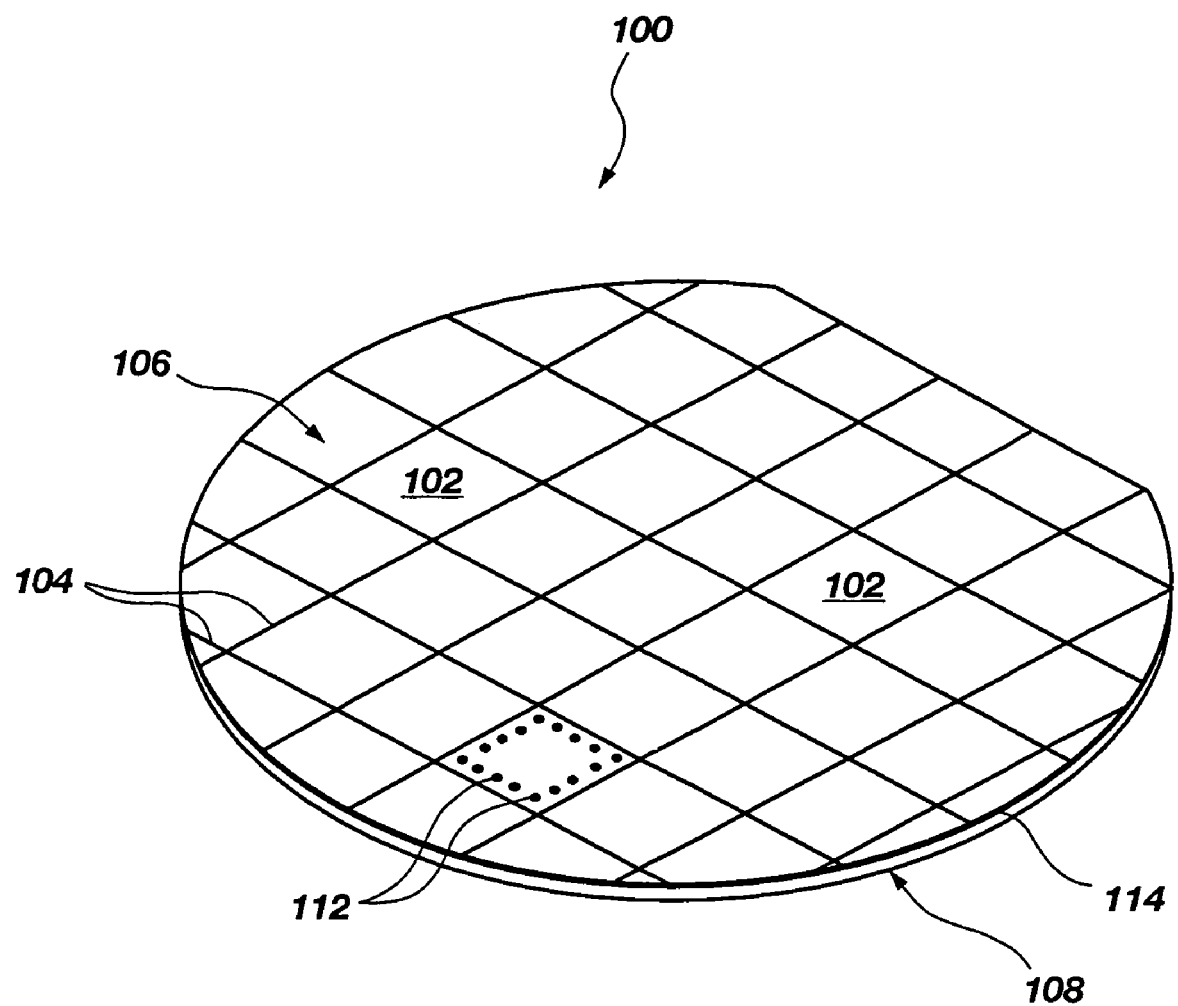
FIG. 1 is a perspective view of a semiconductor wafer containing an array of electronic devices.

The following embodiments of the present invention are provided as examples to assist in a thorough understanding of the present invention. It should be apparent, however, that various additions, modifications and combinations of the embodiments are within the scope of the present invention. In the accompanying drawings, various aspects of the present invention are illustrated to more clearly show the wafer-level packaging structures and methods for their formation. Common elements of the illustrated embodiments are designated with like reference numerals. The drawings are not meant to be illustrative of actual views of any particular portion of a wafer-level packaging structure, but are merely idealized schematic representations which are employed to more clearly and fully depict the invention in connection with the following description.

Referring to FIG. 1, a semiconductor wafer 100 is shown which contains an array of semiconductor devices 102 formed thereon and defined by a plurality of streets or street lines 104. The array of semiconductor devices 102 may be conventionally fabricated as circuit layers (not shown) on and/or extending into one side of wafer 100, forming an active surface 106 of the wafer 100 and, therefore, semiconductor devices 102 formed thereon. The opposite side or backside may remain free of circuitry, leaving a passive surface 108 comprised generally of the semiconductor material of wafer 100. In this manner, many semiconductor devices 102 may be formed and processed substantially simultaneously for subsequent separation into individual or discrete semiconductor dice as will be described in further detail below. Bond pads 112 are also formed on the active surface 106 of each individual or discrete semiconductor device 102 for electrical interconnection between an individual semiconductor device 102 and, for example, a carrier substrate or other electronic device.

A passivation layer 114 may be disposed on the active surface 106 during wafer fabrication. The passivation layer 114 may be formed of, for example, silicon-based materials such as silicon oxides or silicon nitrides, which may be deposited by conventional sputtering or chemical vapor deposition (CVD) processes. The bond pads 112 may be exposed through the passivation layer 114, such as by an etching process.

Figure 2A:
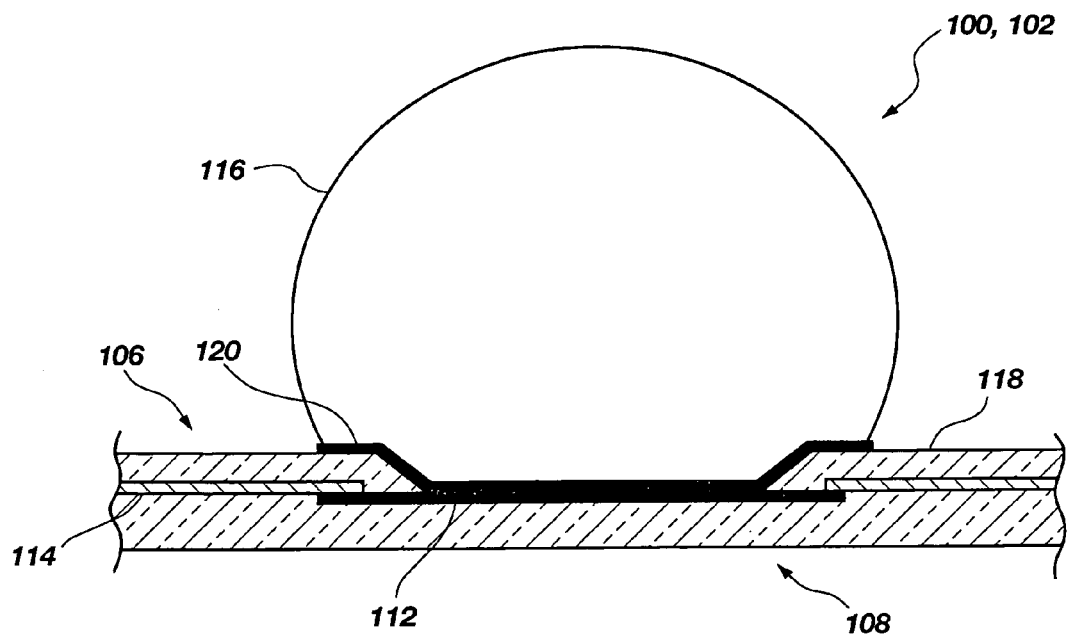
FIG. 2A is a partial sectional view of the wafer shown in FIG. 1 having conductive bumps attached in a direct bump configuration.

Referring to FIG. 2A, a partial sectional view of the wafer 100 and, more particularly, a semiconductor device 102 thereof is shown. Conductive bumps 116 are formed on active surface 106 of wafer 100 in a direct bump configuration over bond pads 112 of the semiconductor device 102. A second passivation layer 118 may be deposited over passivation layer 114, and an under-bump metallization (UBM) 120 may be formed on bond pads 112 and overlap a portion of first and second passivation layers 114, 118. Conductive bumps 116 are then attached to UBM 120 directly over bond pads 112, which may include one or more layers of solder-wettable material or other barrier layers of material thereon. Conductive bumps 116 may be formed using known techniques such as screen printing or by ball bumping with wire bonding equipment. Exemplary materials for conductive bumps 116 may include gold, eutectic tin/lead solder, and conductive or conductor-filled epoxies. Furthermore, while described in terms of bumps, it should be understood that conductive bumps 116 could be configured as balls, columns, pillars, or other desired geometrical configurations.

Figure 2B:
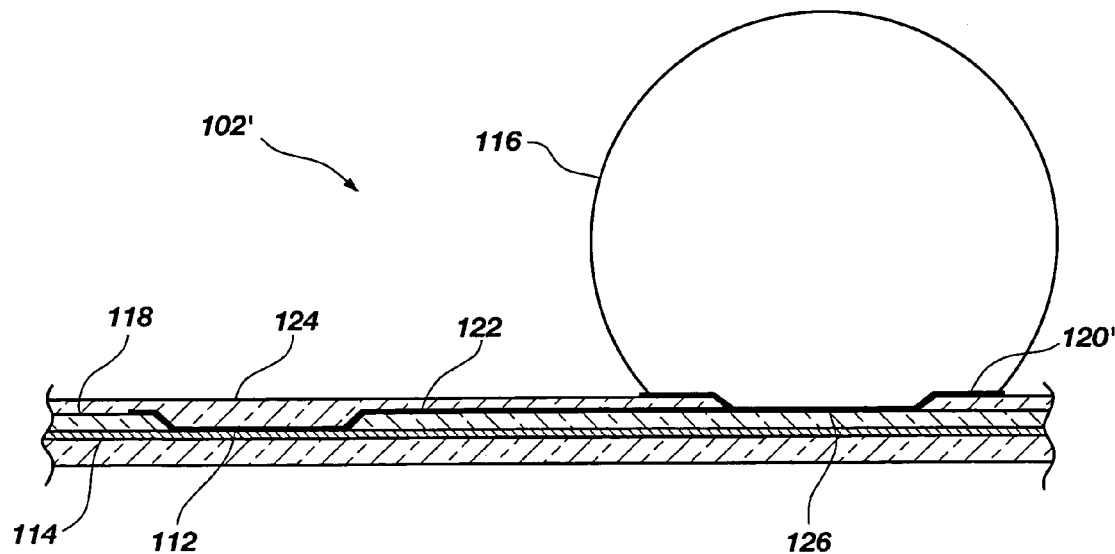
FIG. 2B is a partial sectional view of a wafer having a redistribution layer and associated conductive bumps.

Referring briefly to FIG. 2B, a partial sectional view of a semiconductor device 102' according to another embodiment of the present invention is shown. A redistribution layer (RDL) may be used to relocate connection points for the bond pads 112 of the individual semiconductor device 102'. This may be required when bond pads 112 of a semiconductor device 102' are not configured in a suitable pattern for attachment or are too closely spaced to allow effective formation of conductive bumps 116. Thus, subsequent to depositing second passivation layer 118, redistribution circuits 122 may be formed thereon. Redistribution circuits 122 may be deposited as a layer of metal, polysilicon or other conductive material on second passivation layer 118 and etched to form a desired circuit pattern. Next, a third passivation layer 124 may be deposited over redistribution circuits 122 using similar materials and deposition techniques as with first and second passivation layers 114, 118. The third passivation layer 124 may then be etched to expose new bump connection locations 126 on redistribution circuits 122. A layer of UBM 120' may be formed to cover bump connection locations 126 and overlap a portion of third passivation layer 124, and conductive bumps 116 are attached to UBM 120' directly over bump connection locations 126.

While the presently disclosed invention may be practiced in conjunction with either of the embodiments shown and described with respect to FIGS. 2A and 2B, subsequent discussion of the invention will assume reference to the embodiment shown and described with respect to FIG. 2A for purposes of simplicity and clarity.

Figure 3:
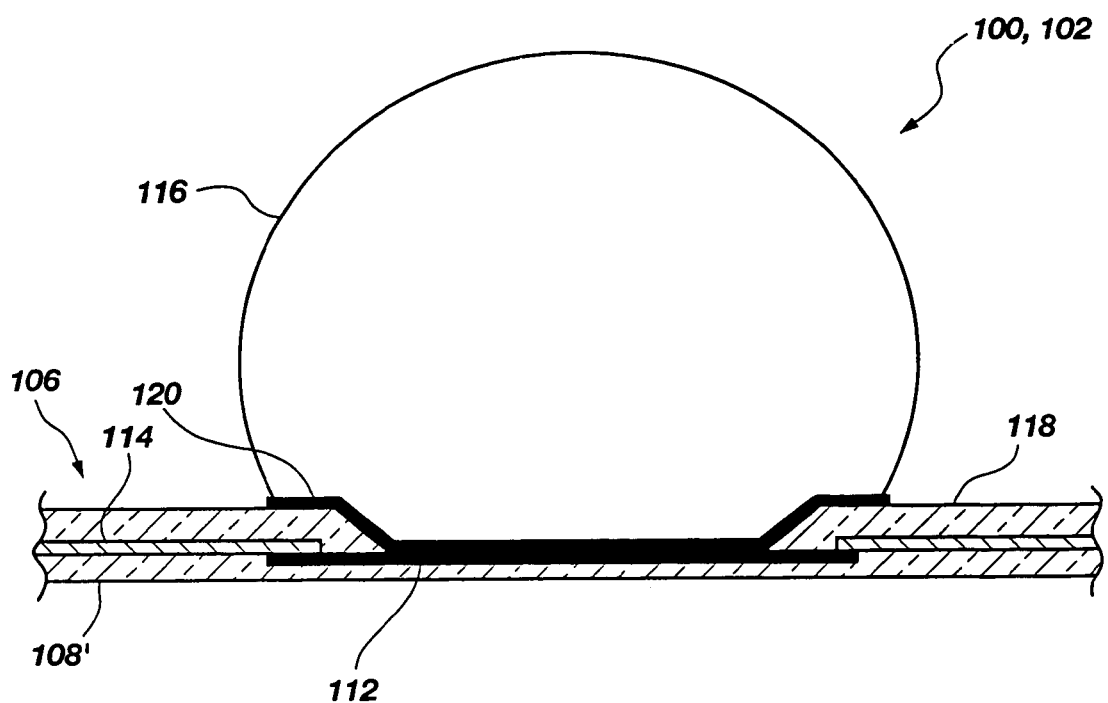
FIG. 3 is a partial sectional view of a wafer subsequent to a back-grinding operation in accordance with an aspect of the present invention.

Referring to both FIGS. 2A and 3, FIG. 3 shows a partial sectional view of the wafer 100 at a further stage of fabrication as compared to that shown in FIG. 2A. Once conductive bumps 116 are added to active surface 106, the wafer 100 may be subjected to a back-grinding process or a chemical-mechanical planarization process to remove a portion of material from the passive or backside surface 108 of the wafer 100.

In removing such material, the wafer 100 may be secured in an appropriate frame member or other retaining apparatus (not shown) with the active surface 106 of the wafer 100 being secured on a surface of a retaining apparatus so that passive or backside surface 108 of the wafer 100 faces upwardly. The wafer 100 may be held in any suitable, known manner to the retaining surface such as, for example, by an adhesive bond, with clamping structures, by drawing a vacuum between active surface 106 and the retaining surface or any suitable combination thereof.

A back-grinding process or chemical-mechanical planarization process may then be employed to remove excess semiconductor material from passive or backside surface 108 of the wafer 100, thereby reducing the thickness of wafer 100 to a desired overall thickness and effectively exposing a new passive or backside surface 108'. The thinning of the wafer 100 may be desirable in order to minimize the final package size. Additionally, such material removal may reduce the time and expense associated with sawing the wafer 100 during subsequent dicing and singulation of the individual semiconductor devices 102. Moreover, thinning of the wafer 100 using a suitable process helps to remove undesirable contaminants which may have been introduced into passive or backside surface 108 of the wafer 100 during fabrication of the semiconductor device 102.

As will be appreciated and understood by those of ordinary skill in the art, several types of processes are available to perform the thinning of the wafer 100. For example, a mechanical grinding process, a mechanical planarization process, a chemical-mechanical planarization process (CMP) or a chemical planarization process could be used to remove material from passive or backside surface 108 of the wafer 100. More specifically, a grinding wheel may be applied to passive or backside surface 108 of the wafer 100 to abrade material therefrom. Alternatively, passive or backside surface 108 of the wafer 100 could be chemically etched to remove material.

Figure 4:
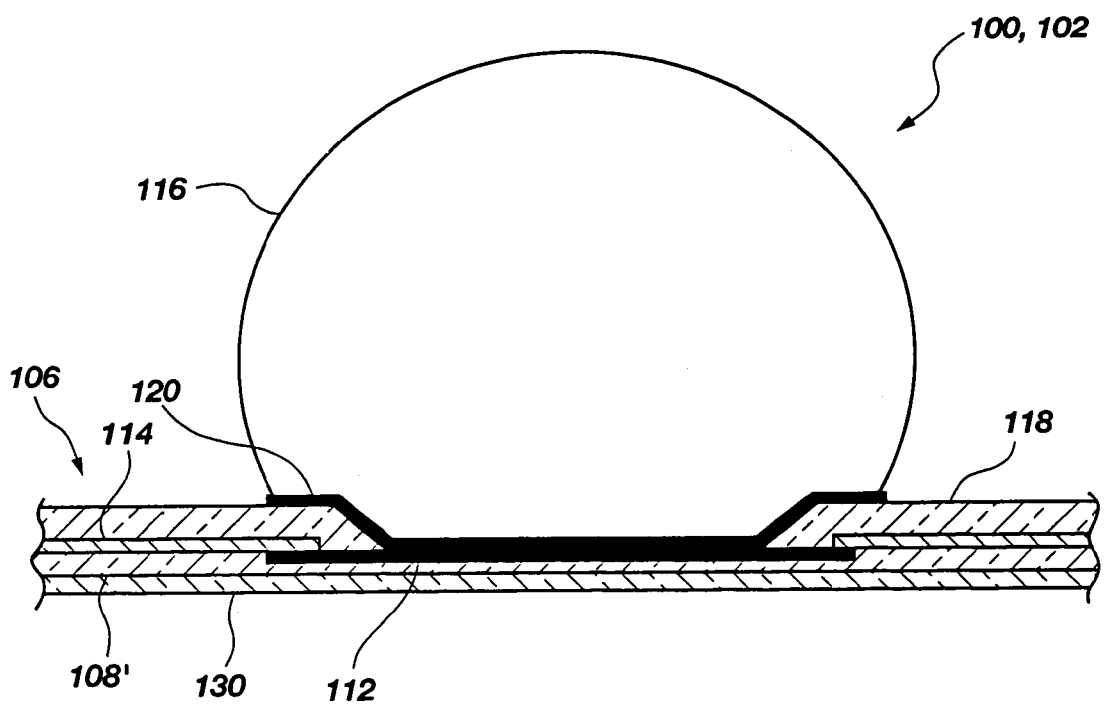
FIG. 4 is a partial sectional view of a wafer having a backside passivation layer formed on a passive surface thereof in accordance with an aspect of the present invention.

Referring now to FIG. 4, after material has been removed from the passive or backside surface 108 (FIG. 2A) of the wafer 100 to a desired thickness, a coating is applied to the newly formed passive or backside surface 108' to form a backside passivation layer 130. In one embodiment, it may be desirable to form the backside passivation layer 130 as a layer of polymer or epoxy applied to passive or backside surface 108' using conventional processes, such as spin coating. However, backside passivation layer 130 could also comprise a suitable layer of glass applied by spin, dip or flow coating, or it could comprise a layer of silicon nitride or silicon oxide deposited by sputtering or CVD. Formation of backside passivation layer 130 may be accomplished while wafer 100 remains attached to the retaining apparatus (not shown) which is used in conjunction with the removal of material from the passive or backside surface 108. Of course, the process of forming the backside passivation layer 130 may be carried out at a location separate from that of the material removal operation if so desired.

Figure 5:
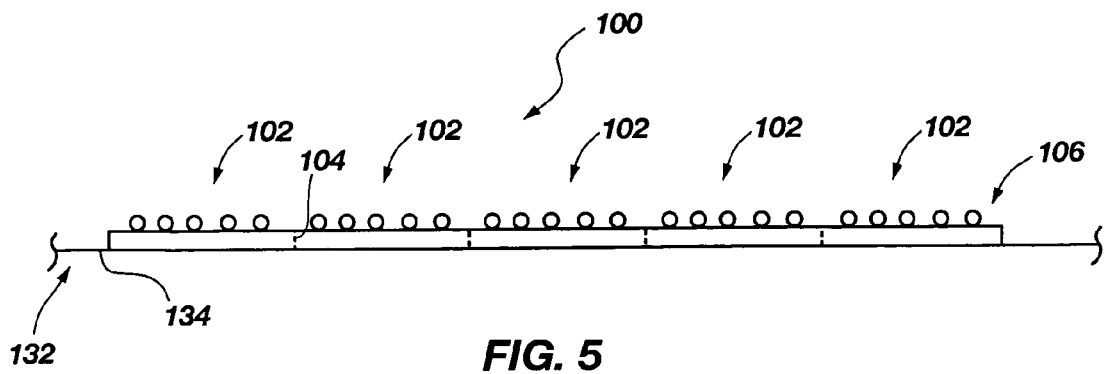
FIG. 5 is a side view of a wafer attached to a frame membrane of a wafer frame.

Referring now to FIG. 5, a side view of the wafer 100 attached to a wafer frame 132 is shown. The wafer 100 may be held in place on the wafer frame 132 by adhesively attaching backside passivation layer 130 (FIG. 4) to a frame membrane 134 such that active surface 106 faces outward or upward. Frame membrane 134 may include, for example, an elastic film or tape formed of a material, such as a polyethylene, a flexible resin or a sheet of similarly resilient material, and be coated with an adhesive. The adhesive may, for instance, include a pressure-sensitive or UV-releasable adhesive that adheres to backside passivation layer 130 without forming a permanent bond. Once attached to wafer frame 132, the wafer 100 may be diced by cutting into active surface 106 along street lines 104 (shown as dashed lines in FIG. 5) running between adjacent semiconductor devices 102. A conventional wafer saw may be used for this operation as will be appreciated by those of ordinary skill in the art.

Figure 6:
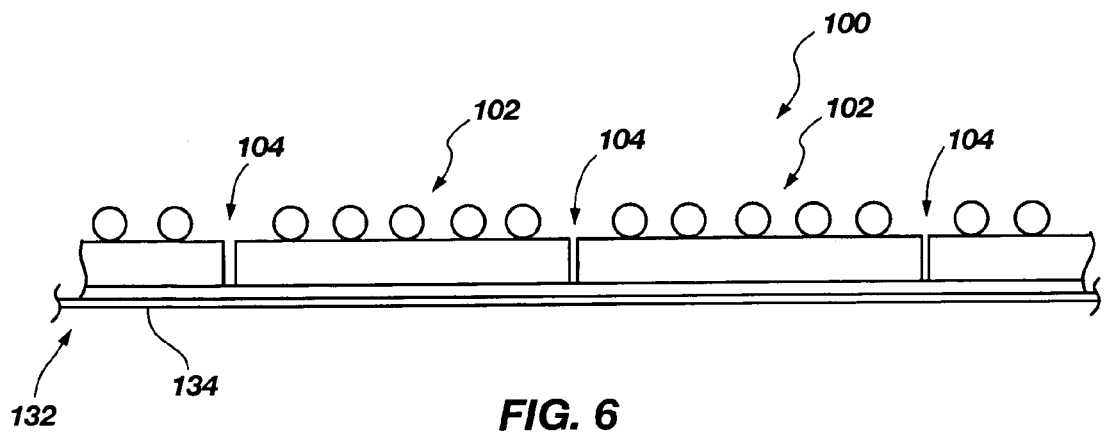
FIG. 6 is a partial sectional view of a wafer attached to a wafer frame and after an initial dicing operation.
Figure 7:
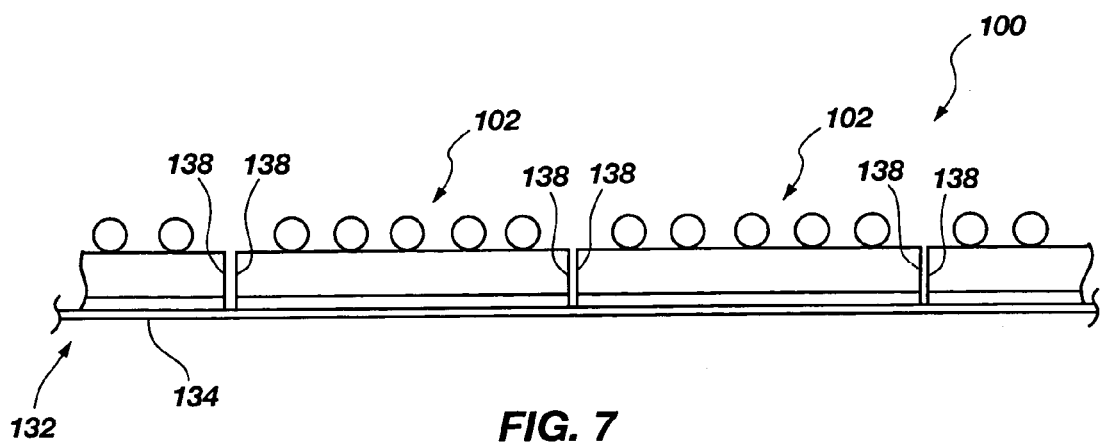
FIG. 7 is a partial sectional view of a wafer attached to a wafer frame and after a secondary dicing operation.

In dicing the wafer 100, a wafer saw (not shown) may cut completely through the wafer 100 without cutting the frame membrane 134. However, the wafer saw need not cut entirely through the wafer 100 in all cases. For example, as discussed above, while the active surface 106 and various passivation layers 118, 124 and UBM 120 (FIG. 2A) may be formed of materials conducive to wafer sawing, the backside passivation layer 130 (FIG. 4) may be formed of a polymer material which tends to gum-up and reduce the efficiency and accuracy of the wafer saw. Thus, if the backside passivation layer 130 is formed as a polymer layer, the cutting depth of the wafer saw may be reduced such that backside passivation layer 130 is not cut, such as is shown in FIG. 6. A force may subsequently be applied to the wafer 100 such as with rollers or other known mechanisms (not shown) so as to sever, fracture, crack or break the backside passivation layer 130 along the cuts corresponding with the street lines 104 and separate the individual semiconductor devices 102, forming individual sidewalls 138 thereon as shown in FIG. 7. In this manner, the wafer saw does not have to cut any polymer material and may remain free from gumming.

Figure 8A:
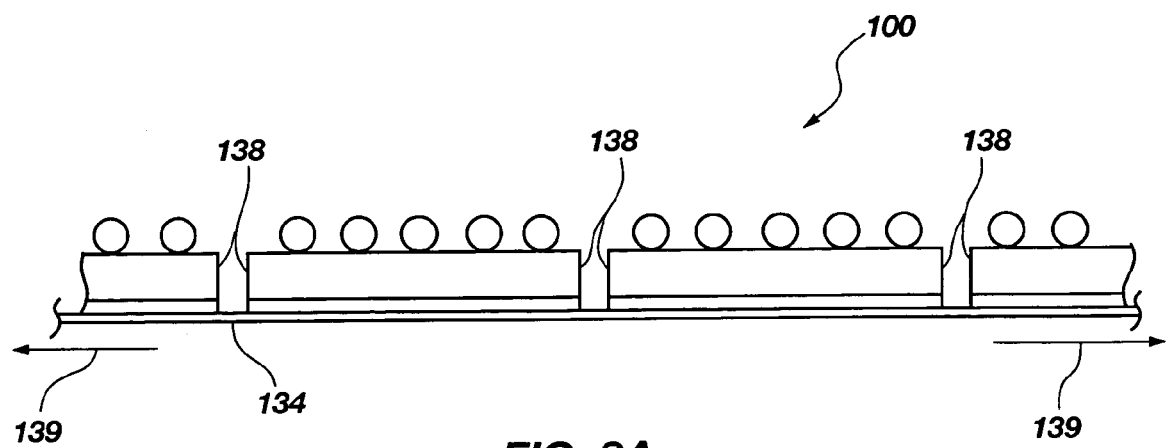
FIGS. 8A and 8B show a partial sectional view and a top view, respectively, of a diced wafer on a stretched frame membrane.
Figure 8B:
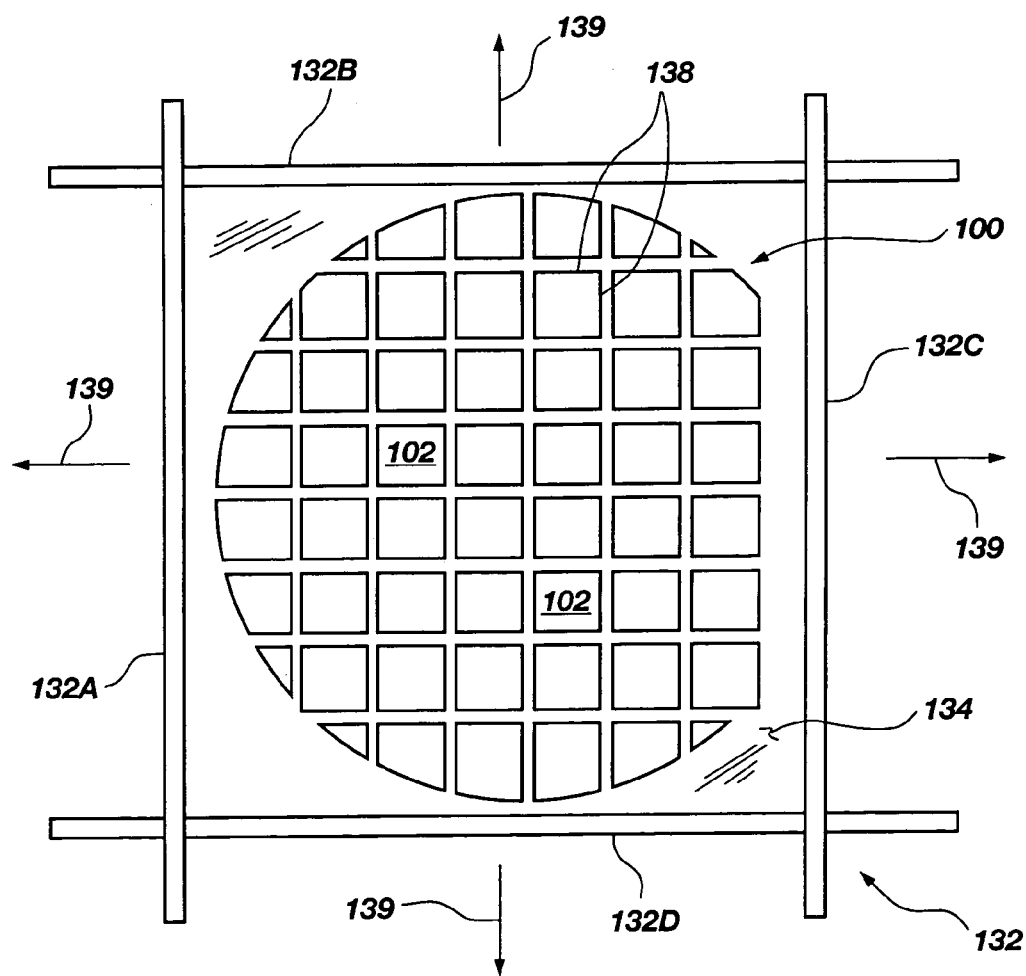

Referring now to FIGS. 8A and 8B, after dicing of the wafer 100 to separate the individual semiconductor devices 102, the membrane 134 may be stretched by the wafer frame 132 to displace the individual semiconductor devices 102 from one another and further expose their sidewalls 138 for subsequent coating. The membrane 134 may be stretched by laterally displacing frame members 132A–132D relative to each other such as is indicated by directional arrows 139.

As shown in FIG. 9, while still attached to the frame membrane 134, a further protective coating may be applied to the individual semiconductor devices 102 and thereby form an active surface passivation layer 140 and side edge passivation layers 142. In one embodiment of the present invention, the semiconductor devices 102 disposed on the stretched frame membrane 134 may be placed in a deposition chamber (not shown) and the active surface and side edge passivation layers 140, 142 may be formed by depositing a layer of polymer or other material on semiconductor devices 102 using CVD or atomic layer deposition (ALD) processes. As is well known in the art, in CVD processes, reactive species in a gaseous atmosphere of elevated temperature chemically react to deposit a film of material such as, for example, a polymer, onto the surfaces of the individual semiconductor devices 102. While very effective, the CVD process must be performed at relatively high temperatures and can introduce impurities from the gas atmosphere into the film of deposited material.

An ALD process, which is a variant of the CVD process, is a relatively new process which allows the formation of high-quality, uniform films and can generally be carried out at lower temperatures than CVD processes. In general terms, an ALD process involves depositing multiple atomic layers on a surface to form a film. Each layer is formed by chemisorption from a precursor gas. A series of reactive precursors is injected into a deposition chamber with an inert gas purge between the introduction of each reactive precursor. A more detailed discussion of ALD processes is presented in U.S. Pat. No. 6,387,185 to Doering et al., the disclosure of which is incorporated herein in its entirety by reference. The deposition rate of ALD is slower than that of CVD, and the selected deposition technique will be selected accordingly based on process considerations as to which benefits are more desirable. It should be understood that CVD and ALD processes are exemplary deposition methods and that other known methods such as, for example, sputtering, may be used as well.

Furthermore, in another embodiment of the present invention, active surface and side edge passivation layers 140, 142 may be formed by spraying a layer of epoxy onto the individual semiconductor devices 102 in an aerosolized form by a dispensing nozzle as will be appreciated by those of ordinary skill in the art.

Referring now to FIG. 10, once active surface and side edge passivation layers 140, 142 are formed, a portion of active surface passivation layer 140 is removed from the individual semiconductor devices 102 to expose a portion of the conductive bumps 116 formed thereon. This operation may also be completed while the individual semiconductor devices 102 remain attached to frame membrane 134. The removal of the portion of active surface passivation layer 140 may be achieved through etching, for example, by a dry plasma etch process or by a wet etching process, such as by dipping the active surface passivation layer 140 into a wet etch solution. Alternatively, the removal may be achieved through a mechanical abrasion process, optionally assisted by a chemical agent, such as by the CMP process described above in relation to the back-grinding operation. The result is a plurality of wafer-level or chip-scale semiconductor packages 150 having passivation layers 130, 140 and 142 which hermetically seal its associated semiconductor device 102 from environmental conditions. It is noted that the side edge passivation layers 142 overlap the edge of the backside passivation layer 130 to form such a seal.

Figure 11:
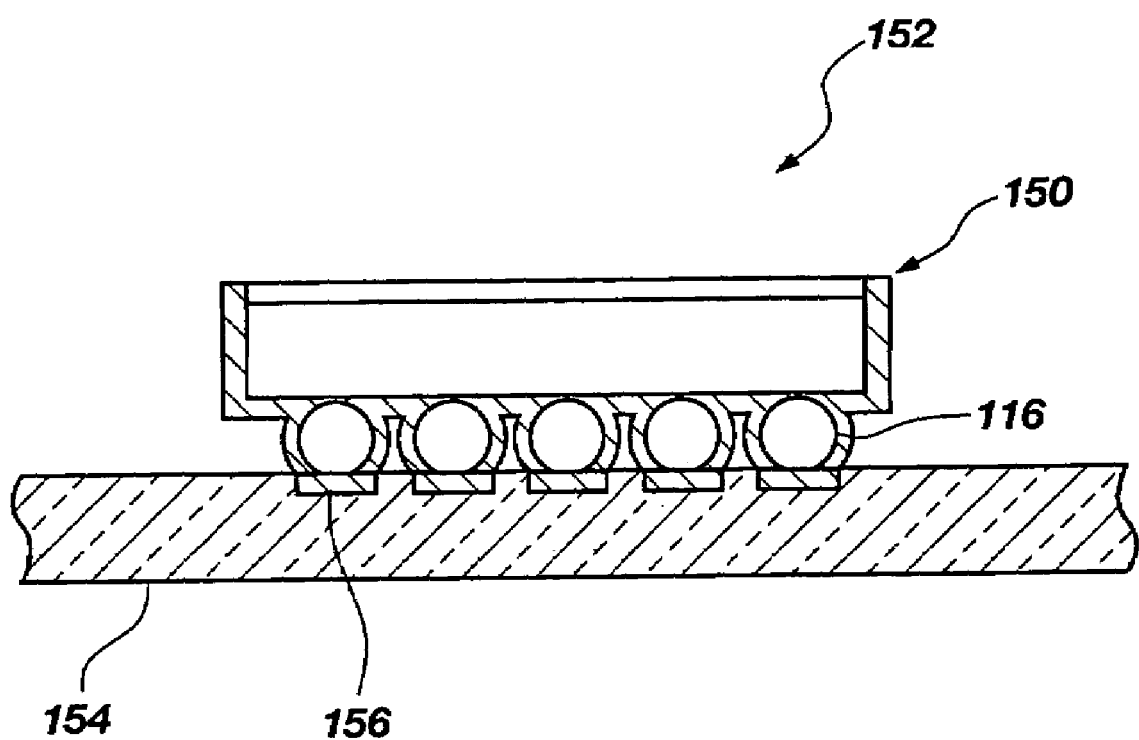
FIG. 11 is a side view showing a semiconductor die attached to a carrier substrate in a flip-chip orientation.

At this point, the plurality of individual semiconductor packages 150 may be removed from the frame membrane 134 for subsequent attachment to circuitry on a carrier substrate or other device such as by TAB or flip-chip bonding. For example, as illustrated in FIG. 11, a memory device 152 may be formed by electrically coupling the conductive bumps 116 of an individual semiconductor package 150 with a carrier substrate 154 by flip-chip bonding to the contact pads 156 formed on the surface of the carrier substrate 154. Such a memory device may be utilized in a computing system, including, for example, a central processing unit operably coupled with the memory device 152, and also coupled with one or more appropriate input devices (e.g., mouse, keyboard, hard drive, etc.) and one or more output devices (e.g., monitor, printer, etc.).

The above-illustrated embodiments of the present invention, and variations thereof, provide wafer-level or chip-scale packaging for semiconductor dice, including sealing of the dice from environmental elements, using a fewer number of fabrication steps and processing time therefor. Although the present invention has been depicted and described with respect to the illustrated embodiments, various additions, deletions and modifications are contemplated within its scope. The scope of the invention is, therefore, indicated by the appended claims rather than the foregoing description. Further, all changes which may fall within the meaning and range of equivalency of the claims and elements and features thereof are to be embraced within their scope.

What is claimed is:

1. A method of fabricating semiconductor packages, the method comprising:

providing a semiconductor wafer having a plurality of semiconductor devices formed thereon;

forming a passivation layer on an underside of the semiconductor wafer including the plurality of semiconductor devices;

adhering the semiconductor wafer to a flexible membrane subsequent forming a passivation layer on an underside of the semiconductor wafer;

dicing the semiconductor wafer to separate the plurality of semiconductor devices and define a plurality of side edges on each semiconductor device of the plurality;

stretching the flexible membrane and laterally displacing the plurality of semiconductor devices relative to one another; and forming a passivation layer on the plurality of side edges of at least one of the plurality of semiconductor devices.

2. The method according to claim 1, further comprising forming a passivation layer on an active surface of the at least one semiconductor device.

3. The method according to claim 2, wherein at least one of forming a passivation layer on an underside of the semiconductor wafer, forming a passivation layer on the plurality of side edges of at least one of the plurality of semiconductor devices and forming a passivation layer on the active surface of the at least one semiconductor device further includes subjecting the at least one semiconductor device to a chemical vapor deposition process.

4. The method according to claim 2, wherein at least one of forming a passivation layer on an underside of the semiconductor wafer, forming a passivation layer on the plurality of side edges of at least one of the plurality of semiconductor devices and forming a passivation layer on an active surface of the at least one semiconductor device further includes subjecting the at least one semiconductor device to an atomic layer deposition process.

5. The method according to claim 2, wherein at least one of forming a passivation layer on an underside of the semiconductor wafer, forming a passivation layer on the plurality of side edges of at least one of the plurality of semiconductor devices and forming a passivation layer on an active surface of the at least one semiconductor device further includes disposing a layer of polymer material on the at least one semiconductor device.

6. The method according to claim 2, wherein at least one of forming a passivation layer on an underside of the semiconductor wafer, forming a passivation layer on the plurality of side edges of at least one of the plurality of semiconductor devices and forming a passivation layer on an active surface of the at least one semiconductor device further includes disposing a layer of epoxy material on the at least one semiconductor device.

7. The method according to claim 2, wherein forming a passivation layer on the active surface of the at least one semiconductor device includes forming a passivation layer over a plurality of conductive bumps on the active surface.

8. The method according to claim 7, further comprising forming a layer of under-bump metallization between each of the plurality of conductive bumps and each of a corresponding plurality of bond pads formed on the semiconductor wafer.

9. The method according to claim 7, further comprising forming a redistribution circuit in the at least one semiconductor device.

10. The method according to claim 1, further comprising removing a volume of material from the underside of the semiconductor wafer prior to forming the passivation layer on the underside of the semiconductor wafer.

11. The method according to claim 10, wherein removing a volume of material from the underside of the semiconductor wafer includes grinding the underside of the semiconductor wafer.

12. The method according to claim 10, wherein removing a volume of material from the underside of the semiconductor wafer includes subjecting the underside of the semiconductor wafer to a chemical-mechanical planarization process.

13. The method according to claim 10, wherein removing a volume of material from the underside of the semiconductor wafer includes subjecting the underside of the semiconductor wafer to a chemical planarization process.

14. The method according to claim 1, wherein adhering the semiconductor wafer to a flexible membrane includes adhering the underside of the semiconductor wafer to the flexible membrane.

15. The method according to claim 14, wherein forming a passivation layer on an underside of the semiconductor wafer includes applying a layer of polymer material to the underside of the semiconductor wafer.

16. The method according to claim 15, wherein dicing the semiconductor wafer includes sawing the semiconductor wafer to a predetermined depth such that the passivation layer on the underside of the semiconductor wafer remains uncut.

17. The method according to claim 16, wherein dicing the semiconductor wafer further includes applying a force to the semiconductor wafer and fracturing the passivation layer on the underside of the semiconductor wafer.

18. The method according to claim 1, wherein forming a passivation layer on the plurality of side edges of at least one of the plurality of semiconductor devices includes overlapping the passivation layer of each of the plurality of side edges over an edge of the passivation layer on the underside of the at least one semiconductor device.

19. A method of fabricating semiconductor packages, the method comprising:
provaiding a semiconductor wafer having a plurality of semiconductor devices formed thereon;
forming a passivation layer on an underside of the semiconductor wafer including the plurality of semiconductor devices;
adhering the semiconductor wafer to a flexible membrane subsequent to forming a passivation layer on the underside of the semiconductor wafer;
dicing the semiconductor wafer to separate the plurality of semiconductor devices and define a plurality of side edges on each semiconductor device of the plurality;
stretching the flexible membrane and laterally displacing the plurality of semiconductor devices relative to one another;
forming a passivation layer on the plurality of side edges of at least one of the plurality of semiconductor devices;
forming a passivation layer on an active surface of the at least one semiconductor device including forming a passivation layer over a plurality of conductive bumps on the active surface; and
removing a portion of the passivation layer formed over the plurality of conductive bumps to expose a portion of at least one conductive bump of the plurality.

20. The method according to claim 19, wherein removing a portion of the passivation layer formed over the plurality of conductive bumps includes grinding the passivation layer formed over the plurality of conductive bumps.

21. The method according to claim 19, wherein removing a portion of the passivation layer formed over the plurality of conductive bumps includes subjecting the passivation layer formed over the plurality of conductive bumps to a chemical-mechanical planarization process.

22. A method of forming a memory device, the method comprising:
providing a semiconductor wafer having a plurality of semiconductor devices formed thereon;
forming a passivation layer on an underside of the semiconductor wafer including the plurality of semiconductor devices;

adhering the semiconductor wafer to a flexible membrane subsequent to forming a passivation layer on an underside of the semiconductor wafer;

dicing the semiconductor wafer to separate the plurality of semiconductor devices and define a plurality of side edges on each semiconductor device of the plurality;

stretching the flexible membrane and laterally displacing the plurality of semiconductor devices relative to one another;

forming a passivation layer on the plurality of side edges of at least one of the plurality of semiconductor devices; and electrically coupling the at least one semiconductor device to a carrier substrate.

23. The method according to claim 22, further comprising forming a passivation layer on an active surface of the at least one semiconductor device.

24. The method according to claim 23 wherein at least one of forming a passivation layer on an underside of the semiconductor wafer, forming a passivation layer on the plurality of side edges of at least one of the plurality of semiconductor devices and forming a passivation layer on an active surface of the at least one semiconductor device further includes subjecting the at least one semiconductor device to a chemical vapor deposition process.

25. The method according to claim 23, wherein at least one of forming a passivation layer on an underside of the semiconductor wafer, forming a passivation layer on the plurality of side edges of at least one of the plurality of semiconductor devices and forming a passivation layer on an active surface of the at least one semiconductor device further includes subjecting the at least one semiconductor device to an atomic layer deposition process.

26. The method according to claim 23, wherein at least one of forming a passivation layer on an underside of the semiconductor wafer, forming a passivation layer on the plurality of side edges of at least one of the plurality of semiconductor devices and forming a passivation layer on an active surface of the at least one semiconductor device includes disposing a layer of polymer material on the plurality of side edges and the active surface of the at least one semiconductor device.

27. The method according to claim 23, wherein at least one of forming a passivation layer on an underside of the semiconductor wafer, forming a passivation layer on the plurality of side edges of at least one of the plurality of semiconductor devices and forming a passivation layer on an active surface of the at least one semiconductor device includes disposing a layer of epoxy material on the at least one semiconductor device.

28. The method according to claim 23, wherein forming a passivation layer on the active surface of the at least one semiconductor device includes forming a passivation layer over a plurality of conductive bumps on the active surface.

29. The method according to claim 28, further comprising forming a layer of under-bump metallization between each of the plurality of conductive bumps and each of a corresponding plurality of bond pads formed on the semiconductor wafer.

30. The method according to claim 28, further comprising forming a redistribution circuit in the at least one semiconductor die.

31. The method according to claim 22, further comprising removing a volume of material from the underside of the semiconductor wafer prior to forming the passivation layer on the underside of the semiconductor wafer.

32. The method according to claim 31, wherein removing a volume of material from the underside of the semiconductor wafer includes grinding the underside of the semiconductor wafer.

33. The method according to claim 31, wherein removing a volume of material from the underside of the semiconductor wafer includes subjecting the underside of the semiconductor wafer to a chemical-mechanical planarization process.

34. The method according to claim 31, wherein removing a volume of material from the underside of the semiconductor wafer includes subjecting the underside of the semiconductor wafer to a chemical planarization process.

35. The method according to claim 22, wherein adhering the semiconductor wafer to a flexible membrane includes adhering the underside of the semiconductor wafer to the flexible membrane.

36. The method according to claim 35, wherein forming a passivation layer on an underside of the semiconductor wafer includes applying a layer of polymer material to the underside of the semiconductor wafer.

37. The method according to claim 36, wherein dicing the semiconductor wafer includes sawing the semiconductor wafer to a predetermined depth such that the passivation layer on the underside of the semiconductor wafer remains uncut.

38. The method according to claim 37, wherein dicing the semiconductor wafer further includes applying a force to the semiconductor wafer and fracturing the passivation layer on the underside of the semiconductor wafer.

39. The method according to claim 22, wherein forming a passivation layer on the plurality of side edges of at least one of the plurality of semiconductor devices includes overlapping the passivation layer of each of the plurality of side edges over an edge of the passivation layer on the underside of the at least one semiconductor device.

40. The method according to claim 22, wherein electrically coupling the at least one semiconductor device to a carrier substrate includes mounting the at least one semiconductor device on a surface of the carrier substrate in a flip-chip arrangement.

41. A method of forming a memory device, the method comprising:

providing a semiconductor wafer having a plurality of semiconductor devices formed thereon;

forming a passivation layer on an underside of the semiconductor wafer including the plurality of semiconductor devices;

adhering the semiconductor wafer to a flexible membrane subsequent to forming a passivation layer on the underside of the semiconductor wafer;

dicing the semiconductor wafer to separate the plurality of semiconductor devices and define a plurality of side edges on each semiconductor device of the plurality;

stretching the flexible membrane and laterally displacing the plurality of semiconductor devices relative to one another;

forming a passivation layer on the plurality of side edges of at least one of the plurality of semiconductor devices;

electrically coupling the at least one semiconductor device to a carrier substrate;

forming a passivation layer on an active surface of the at least one semiconductor device including forming a passivation layer over a plurality of conductive bumps on the active surface; and removing a portion of the passivation layer formed over the plurality of conductive bumps to expose a portion of at least one conductive bump of the plurality.

42. The method according to claim 41, wherein removing a portion of the passivation layer formed over the plurality of conductive bumps includes grinding the passivation layer formed over the plurality of conductive bumps.

43. The method according to claim 41, wherein removing a portion of the passivation layer formed over the plurality of conductive bumps includes subjecting the passivation layer formed over the plurality of conductive bumps to a chemical-mechanical planarization process.

* * * * *